(12) United States Patent
Ono et al.

(10) Patent No.: US 6,649,328 B2
(45) Date of Patent: Nov. 18, 2003

(54) METHOD FOR MANUFACTURE OF MOLDING DIE FOR FRESNEL LENS SHEET

(75) Inventors: Youji Ono, Kitakanbara-gun (JP); Katsuhiko Hayashi, Tokyo (JP)

(73) Assignee: Kuraray Co., Ltd., Okayama (JP)

( * ) Notice: Subject to any disclaimer, the term of this patent is extended or adjusted under 35 U.S.C. 154(b) by 29 days.

(21) Appl. No.: 10/033,921

(22) Filed: Jan. 3, 2002

(65) Prior Publication Data

US 2002/0094495 A1 Jul. 18, 2002

(30) Foreign Application Priority Data

Jan. 15, 2001 (JP) ........................................ 2001-006088
Sep. 18, 2001 (JP) ........................................ 2001-283820

(51) Int. Cl.[7] ................................................ G02B 3/08
(52) U.S. Cl. ......................... 430/320; 264/2.5; 427/514
(58) Field of Search ......................... 430/320; 264/1.36, 264/1.38, 2.5; 427/514

(56) References Cited

U.S. PATENT DOCUMENTS 3,718,078 A * 2/1973 Plummer ................... 264/2.5
5,997,709 A * 12/1999 Krinke ........................ 205/22

FOREIGN PATENT DOCUMENTS

JP 58-037629 A * 3/1983

* cited by examiner

Primary Examiner—John A. McPherson
(74) Attorney, Agent, or Firm—Oblon, Spivak, McClelland, Maier & Neustadt, P.C.

(57) ABSTRACT

A method for the manufacture of a Fresnel lens sheet is disclosed. The Fresnel lens sheet have arranged thereon a multiplicity of sawtooth-like Fresnel lenses composed of a Fresnel lens surface demonstrating a convex lens function and a rise surface located between the adjacent Fresnel lens surfaces. This sheet has a layer containing a light-diffusing material or a light-absorbing material on the rise surfaces. The method comprises the steps of, coating a photoresist on the Fresnel lens surfaces and rise surfaces, and forming the layer containing a light-diffusing material or a light-absorbing material on the rise surfaces by exposing the photoresist at mutually different light exposure doses per unit surface area on the Fresnel lens surfaces and rise surfaces.

5 Claims, 2 Drawing Sheets

METHOD FOR MANUFACTURE OF MOLDING DIE FOR FRESNEL LENS SHEET

BACKGROUND OF THE INVENTION

1. Field of the Invention

The present invention relates to a method for the manufacture of a Fresnel lens sheet used in rear projection type image display devices and so forth and to a method for the manufacture of a molding die for a Fresnel lens sheet.

2. Description of the Prior Art

A schematic structure of a transmission type screen that has been typically used in rear projection type televisions is shown in FIG. 2. In FIG. 2, the reference numeral 1 stands for a Fresnel lens sheet and the reference numeral 2 stands for a lenticular lens sheet. The Fresnel lens sheet 1 and lenticular lens sheet 2 are usually tightly bonded to each other forming a transmission screen. The Fresnel lens sheet typically comprises a sheet having a Fresnel lens provided on the light outgoing surface thereof, the Fresnel lens being composed of equidistantly located, concentric circular lenses of a very small pitch. The Fresnel lens has a saw-tooth cross section with Fresnel lens surfaces 4 inclined with respect to a light incidence surface 3 (FIG. 3). In the lenticular lens sheet 2, semicylindrical lenses are arranged equidistantly on the light incidence surface and on the light outgoing surface. A parallel or converging light outgoing from the Fresnel lens sheet is greatly diffuses in the horizontal direction by the lenticular lens sheet 2. As a result, an image can be observed in a wide view range in the horizontal direction. A material containing a diffusing agent dispersed therein is typically used for the lenticular lens sheet to expand the image viewable range not only in the horizontal direction, but also in the vertical direction.

An image light L1 projected by a projector (not shown in the figures) disposed at the rear surface side of the transmission screen comprising the Fresnel lens sheet 1 and lenticular lens sheet 2 is refracted (L2) on the incidence surface 3 of Fresnel lens sheet 1, as shown in FIG. 3, again refracted on the outgoing surfaces (Fresnel lens surfaces) 4, and outgoes (L3) thus being converted into a parallel beam or a converged beam focused in a point located at a distance of 5~20 m to the observation side from the screen. However, when the light outgoes from the Fresnel lens surfaces 4, part of light L4 is reflected by the Fresnel lens surfaces 4, becomes confined in the Fresnel lens sheet, again reflected (L5) by the incidence surface 3, and again falls on the Fresnel lens surfaces 4. Such useless light beam L5 reaches the rise surfaces 5 directly or upon another reflection by the Fresnel lens surfaces 4 and outgoes from the rise surfaces 5 (L6).

Thus, in the conventional Fresnel lens sheet, the incident light beam L1 outgoes not only as the light beam L3 which essentially has to be the outgoing light beam, but also as the useless light beam L6 outgoing from a different place. As a result, a ghost image is produced and the contrast is greatly degraded. A technology of providing a light-absorbing layer or light-scattering layer on the rise surfaces is known for suppressing the formation of a ghost image by the useless light (Japanese Patent Application Laid-open Nos. S50-123448 and S52-143847).

Japanese Patent Application Laid-open No. S50-123448 discloses a technology by which a Fresnel lens sheet coated with a dispersion having suspended therein light-absorbing or light-scattering particles with a size of several microns to several tens of microns is rotated and a light-absorbing layer or light-scattering layer is formed on the rise surfaces by a centrifugal force. A problem associated with this publicly disclosed method was that when the viscosity of the dispersion that was be coated was low, the dispersion located on the peak portions of the rise surfaces was sprayed into the air by the centrifugal force at the time of spin coating, the film thickness decreased, and the desired light-absorbing layer or light-scattering layer was difficult to obtain. Another problem was that the dispersion bulged out toward the Fresnel lens surfaces in the valley portions of the rise surfaces and the transmissivity was decreased. Furthermore, Japanese Patent Application Laid-open No. S52-143847 disclosed a technology of coating the Fresnel lens sheet surface with a liquid prepared by mixing a fine powder of carbon black with an appropriate solvent and then wiping with a cloth to provide a light-absorbing layer. However, with such a technology, it was difficult to coat the liquid uniformly and only products with poor appearance could be obtained. In recent years, the pitch of Fresnel lenses is required to be decreased to improve the image contrast. However, in the Fresnel lens with a small pitch, the height of rise surfaces unavoidably decreases on the lens periphery. As a result, within the framework of the above-described conventional technology, it is difficult to provide on the rise surfaces a light-absorbing or light-diffusing layer which effectively suppresses ghost images.

SUMMARY OF THE INVENTION

In view of the foregoing, it is an object of the present invention to provide a Fresnel lens sheet which makes it possible to suppress the formation of ghost images by the useless light and to obtain images with good contrast.

It is another object of the present invention to provide a method for the manufacture of a molding die for such Fresnel lens sheet.

According to one aspect of the present invention, for achieving the above-mentioned object, there is provided a method for the manufacture of a Fresnel lens sheet having arranged thereon a multiplicity of sawtooth-like Fresnel lenses composed of a Fresnel lens surface demonstrating a convex lens function and a rise surface located between the adjacent Fresnel lens surfaces, this sheet having a layer containing a light-diffusing material or a light-absorbing material on the rise surfaces, the method comprising the steps of, coating a photoresist on the Fresnel lens surfaces and rise surfaces, and forming the layer containing a light-diffusing material or a light-absorbing material on the rise surfaces by exposing the photoresist at mutually different light exposure doses per unit surface area on the Fresnel lens surfaces and rise surfaces.

According to another aspect of the present invention, there is provided a method for e manufacture of a molding die suitable for the manufacture of a Fresnel lens sheet having arranged thereon a multiplicity of sawtooth-like Fresnel lenses composed of a Fresnel lens surface demonstrating a convex lens function and a rise surface located between the adjacent Fresnel lens surfaces, this sheet having a light-diffusing layer with a convexo-concave structure on the rise surfaces, the method comprising a step of forming a layer containing fine particles on the rise surfaces by coating a photoresist containing fine particles on the surface of a Fresnel lens original mold having Fresnel lens surfaces and rise surfaces or on the surface of a transfer mold of the Fresnel lens original mold and illuminating with light so as to obtain mutually different light exposure doses per unit surface area on the Fresnel lens surfaces and rise surfaces.

DETAILED DESCRIPTION OF THE PREFERRED EMBODIMENTS

Figure 1:
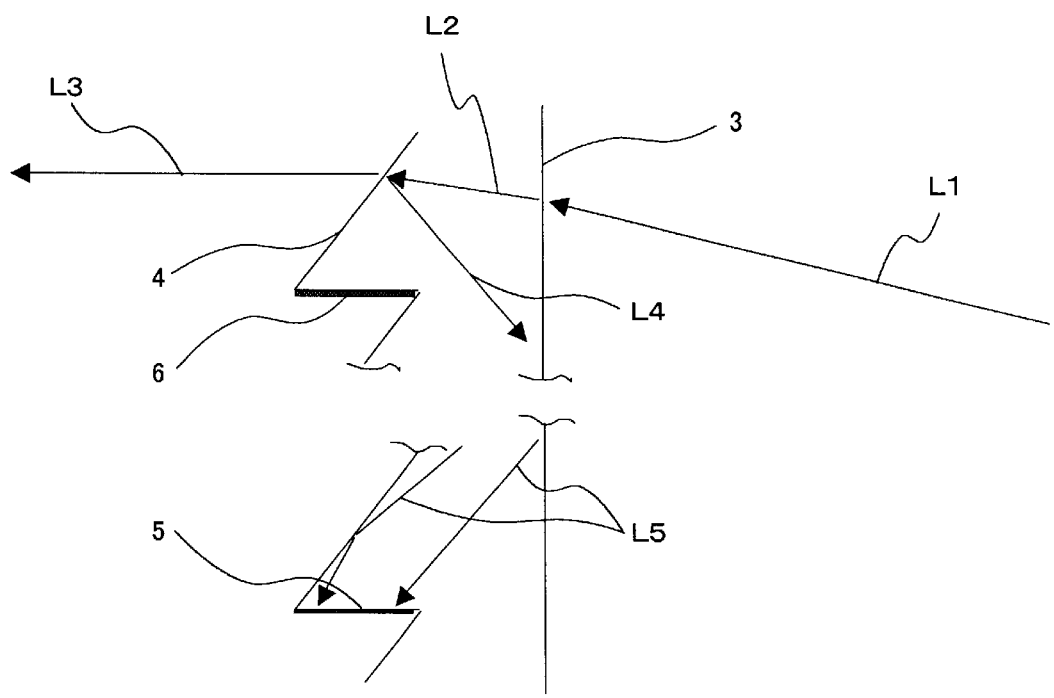
FIG. 1 shows a sectional view of a Fresnel lens sheet manufactured by a method according to the present invention.
Figure 2:
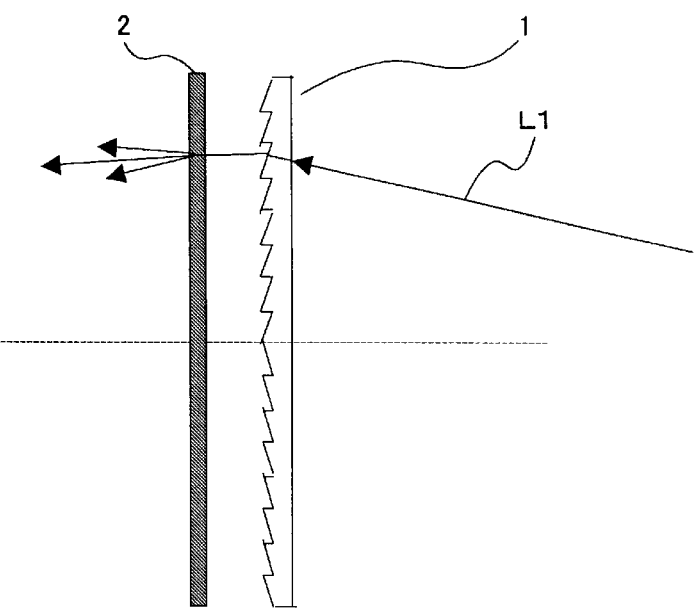
FIG. 2 shows a schematic structure of a transmission type screen that has been typically used in rear projection type televisions.
Figure 3:
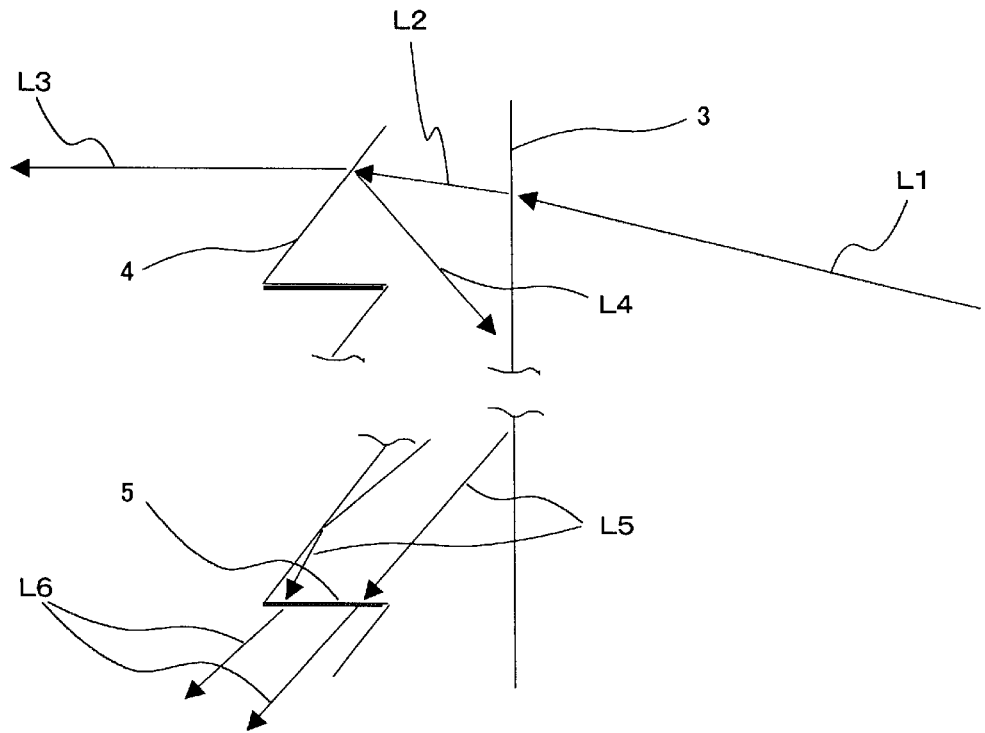
FIG. 3 shows a path of light entered into a Fresnel lens sheet.

A method for the manufacture of a Fresnel lens sheet is disclosed. The Fresnel lens sheet have arranged thereon a multiplicity of sawtooth-like Fresnel lenses composed of a Fresnel lens surface demonstrating a convex lens function and a rise surface located between the adjacent Fresnel lens surfaces. This sheet has a layer containing a light-diffusing material or a light-absorbing material on the rise surfaces. The method comprises the steps of, coating a photoresist on the Fresnel lens surfaces and rise surfaces, and forming the layer containing a light-diffusing material or a light-absorbing material on the rise surfaces by exposing the photoresist at mutually different light exposure doses per unit surface area on the Fresnel lens surfaces and rise surfaces.

Here, one of the following method (1), (2) may be selected in the above method for the manufacture of Fresnel lens sheet. (1) The layer containing a light-diffusing material or light-absorbing material is formed on the rise surfaces by exposing the photoresist comprising a light-diffusing material or light-absorbing material at mutually different light exposure doses per unit surface area on the Fresnel lens surfaces and rise surfaces so that the photoresist present on the Fresnel lens surfaces can be selectively removed when the photoresist is developed after light illumination, and then developing the photoresist for selectively removing the photoresist present on the Fresnel lens surfaces. (2) A layer of the photoresist is formed on the Fresnel lens surfaces by exposing the photoresist at mutually different light exposure doses per unit surface area on the Fresnel lens surfaces and rise surfaces so that the photoresist present on the rise surfaces can be selectively removed when the photoresist is developed after light illumination, and then developing the photoresist for selectively removing the photoresist present on the rise surfaces, and the layer containing a light-diffusing material or light-absorbing material is formed on the rise surfaces by coating a light-diffusing material or light-absorbing material onto the rise surfaces and onto the photoresist present on the Fresnel lens surfaces, and then selectively removing the photoresist layer present on the Fresnel lens surfaces together with the light-diffusing material or light-absorbing material present on the photoresist layer.

Also, the following method is disclosed. (3) The layer containing a light-diffusing material or light-absorbing material is formed on the rise surfaces by coating a light-diffusing material or light-absorbing material on the Fresnel lens surfaces and rise surfaces, then coating a photoresist on the layer of the light-diffusing material or light-absorbing material, exposing the photoresist at mutually different light exposure doses per unit surface area on the Fresnel lens surfaces and rise surfaces, then developing the photoresist and selectively removing the photoresist present on the Fresnel lens surface, then selectively removing the light-diffusing material or light-absorbing material present on the Fresnel lens surfaces; and then removing the photoresist present on the rise surfaces.

A Fresnel lens original mold as referred to herein has the same shape of the light outgoing surface as that of the target Fresnel lens sheet or the shape inverted with respect thereto; no limitation is placed on material thereof. Furthermore, a transfer mold thereof is obtained by transferring the Fresnel lens original mold at least one time; no limitation is placed on material thereof. Furthermore, a Fresnel lens sheet molding die as referred to herein indicates a die used for the manufacture of a Fresnel lens sheet by a variety of molding methods. The above-mentioned Fresnel lens original mold, a transfer mold thereof, and a mold obtained by further transferring those molds can be used as the molding die.

In the method for the manufacture of a Fresnel lens sheet described in sections (1) or (3) above, if a positive photoresist is used, the photoresist may be exposed from the direction perpendicular to the Fresnel lens sheet so that the light exposure dose per unit surface area of the Fresnel lens surfaces is greater than the light exposure dose pre unit surface area of the rise surfaces. If a negative photoresist is used, the photoresist may be exposed from the direction inclined with respect to the Fresnel lens sheet so that the light exposure dose per unit surface area of the rise surfaces is greater than the light exposure dose per unit surface area of the Fresnel lens surfaces. Furthermore, in the method for the manufacture of a Fresnel lens sheet described in section (2), if a negative photoresist is used, the photoresist may be exposed from the direction perpendicular to the Fresnel lens sheet so that the light exposure dose per unit surface area of the Fresnel lens surfaces is greater than the light exposure dose per unit surface area of the rise surfaces. If a positive photoresist is used, the photoresist may be exposed from the direction inclined with respect to the Fresnel lens sheet so that the light exposure dose per unit surface area of the rise surfaces is greater than the light exposure dose per unit surface area of the Fresnel lens surfaces. In the method for the manufacture of a molding die used for the manufacture of a Fresnel lens sheet, the light exposure dose per unit surface area of the rise surfaces and the light exposure dose per unit surface area of the Fresnel lens surfaces may be changed according to the type of photoresist.

The rise angle of the Fresnel lens (or molding die) in accordance with the present invention in various aspects thereof is preferably within a range of ±10° with respect to an optical axis of the lens. If the rise angle is too large and exceeds this range, a large difference between the light exposure dose per unit surface area of the Fresnel lens surfaces and rise surfaces at the time of photoresist exposure cannot be obtained and sometimes it is impossible to form a layer of a photoresist containing a light-diffusing material or light-diffusing material (or a layer of a light-diffusing material or light-absorbing material) selectively on the rise surface. Furthermore, in accordance with the present invention in various aspects thereof, it is preferred that peaks and valleys having a depth of 1~10 μm be provided on the rise surfaces because it allows a photoresist containing a light-diffusing material to adhere to the rise surfaces with greater selectivity.

In the method for the manufacture of a Fresnel lens sheet as described in sections (1)~(3) above, a photoresist containing a light-diffusing material or light-absorbing material, a usual photoresist, or a light-diffusing material or light-absorbing material is coated on the Fresnel lens surfaces or rise surfaces. A resin curable by ionizing radiation such as UV radiation may be used as the photoresist. Furthermore, in the method for the manufacture of a molding die for a Fresnel lens sheet, a photoresist containing fine particles is coated on the surface of the molding die. Examples of suitable coating methods include a spin coating method, screen printing, curtain coating, roll coating, spray coating, and the like.

With the spin coating method, a liquid is placed in the vicinity of the center of the article to be coated, the article is rotated at a high speed, and the liquid is uniformly coated on the entire surface of the article by the centrifugal force. Since the rise surfaces of Fresnel lens sheet are almost perpendicular to the lens sheet surface, the photoresist containing a light-diffusing material that has adhered to the rise surfaces is difficult to remove even if the lens sheet is rotated at a high speed. On the other hand, the photoresist that has adhered to the Fresnel lens surfaces slides over the Fresnel lens surfaces and is sprayed into the air from the outer side of the lens sheet if the lens sheet is rotated at a high speed, which makes it possible to coat a light-diffusing material selectively on the rise surfaces. Therefore, even if the quantity of the light-diffusing material placed in the vicinity of the center of the lens sheet during spin coating is decreased to a level such that the light-diffusing material remaining on the Fresnel lens surfaces causes no practical problems, a layer of the light-diffusing material with a thickness sufficient to suppress ghost formation by the useless light can be formed on the rise surfaces.

The viscosity of the photoresist used for spin coating is preferably no less than 0.01 poise and no more than 50 poise. If the viscosity is below this range, the excess amount of the coating liquid that has adhered to the rise surfaces is sprayed into the air and the effect of the present invention, that is, the prevention of the useless light appearance, sometimes cannot be produced to a full extent. If the viscosity is above this range, the coating solution present on the Fresnel lens surfaces cannot be fully removed during spin coating, sometimes causing decrease in transmissivity and degradation of external appearance. It is even more preferred that the viscosity of the coating solution be no less than 0.1 poise and no more than 30 poise. Furthermore, the rotation speed during spin coating is preferably no less than 500 rpm because such a rate makes it possible to completely remove the coating solution present on the Fresnel lens surfaces during spin coating.

In the method for the manufacture of a Fresnel lens sheet as described in section (3) above, the following means can be selected for selective removal of the layer of a light-diffusing material or light-absorbing material present on the Fresnel lens surfaces. (i) The layer of a light-diffusing material or light-absorbing material present on the Fresnel lens surfaces is selectively removed by immersion into a solution which dissolves the light-diffusing material or light-absorbing material present on the Fresnel lens surfaces, but does not dissolve the photoresist present on the rise surfaces. (ii) The layer of a light-diffusing material or light-absorbing material present on the Fresnel lens surfaces is selectively removed by a physical removal method such as wiping, sandblasting, and the like. (iii) The layer of a light-diffusing material or light-absorbing material present on the Fresnel lens surfaces is selectively removed in a gas phase, for example, by gas etching, evaporation, and the like.

In accordance with the invention relating to a Fresnel lens sheet, in all aspects thereof, it is preferred that a transparent or white particulate material such as glass powder, resin powder, white dye, and the like be used as the light-diffusing material, because the moiré produced by interference with the lenticular lens is reduced. Furthermore, in the methods for the manufacture of a Fresnel lens sheet as described in sections (2) or (3), a mixture of the above-mentioned glass powder and the like with water, organic solvent, a binder and the like can be used as the light-diffusing material that adheres to the rise surfaces. The particle size of the glass powder is preferably within a range of 0.150 $\mu$m, even more preferably, within a range of 120 $\mu$m. It is preferred that the particle size of the glass powder or the like be no more than ⅕ of the distance (width of Fresnel lens surfaces) between the rise surfaces of neighboring Fresnel lenses. If the particle size of glass particle and the like is above this range, the transmissivity of Fresnel lens sheet is sometimes degraded. In accordance with the present invention, in various aspects thereof, a dye such as a direct dye, dispersed dye, and the like, or black particles such as carbon black, pigment, and the like can be used as the light-absorbing material. The dye or black particles are used, for example, in the form of a liquid light-absorbing agent upon mixing with water, organic solvent, and binder.

Furthermore, a glass powder, resin powder, white pigment, as well as metal powder, metal oxide powder, colored and black dye, and the like can be used as fine particles in the method for the manufacture of a molding die used for the manufacture of a Fresnel lens sheet. The particle size of glass powder or the like is preferably within a range of 0.1~50 $\mu$m, even more preferably, within a range of 1~20 $\mu$m. It is preferred that the particle size of the glass powder or the like be no more than ⅕ of the distance between the rise surfaces of neighboring Fresnel lenses.

Figure 4:
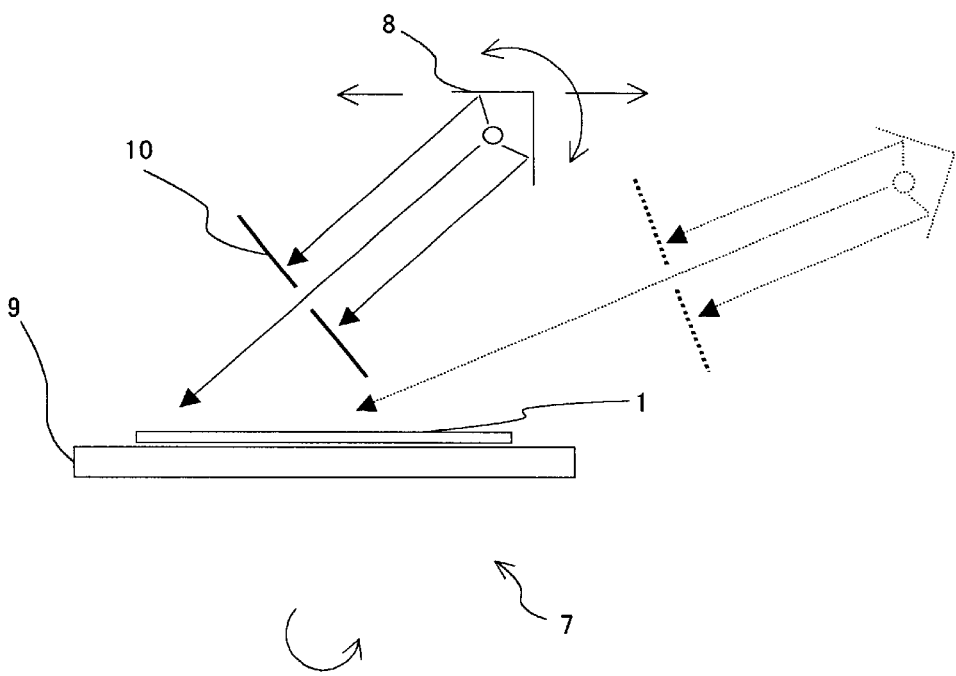
FIG. 4 is a schematic diagram showing a UV illumination device used in the method according to the present invention.

Examples of light sources used in accordance with the present invention, in various aspects thereof, include mercury lamps, halogen lamps, metal halide lamps, and the like. It is preferred that a parallel light beam from a light source be obtained by using a reflective mirror or the like. Obtaining a parallel beam makes it possible to increase the difference in the light exposure dose between the Fresnel lens surfaces and rise surfaces. An example of the light source used in accordance with the present invention, in various aspects thereof, is shown in FIG. 4. A UV illumination device 7 shown in FIG. 4 comprises a light source 8 producing a parallel beam, a light source moving device (not shown in the figure) which continuously moves the light source 8 in the radial direction of a rotary stand 9, an angle changing device (not shown in the figure) which can change the angle at which the UV radiation outgoes toward the rotary stand from −90° to 90° (the radiation outgoes perpendicular to the rotary stand 9 when the angle is 0°), and a slit 10. If necessary, a light source moving device (not shown in the figures) may be provided, this device continuously moving the light source 8 in the direction perpendicular to the rotary stand 9. The entire surface of the Fresnel lens sheet 1 is illuminated with UV radiation by moving the light source 8, while rotating the Fresnel lens sheet 1 about the axis passing through the center of Fresnel lens with the rotary stand 9. The shifting direction of the UV illumination position may be form the inner zone to the outer periphery of the Fresnel lens sheet, or from the outer periphery to the inner zone, or from the outer periphery to the outer periphery on the opposite side via the center of rotation. When the UV exposure dose of the Fresnel lens surfaces is made greater than that of the rise surfaces, the light source may be moved, while the angle of UV illumination is being fixed so as to be almost perpendicular to the rotary stand 9, or the light source may be moved, while the illumination angle is being changed so that the UV radiation is incident parallel to the rise surfaces. Furthermore, when the UV exposure dose of the rise surfaces is made greater than that of the Fresnel lens surfaces, the light source may be moved while the angle of UV illumination is being changed depending on the position of the Fresnel lens sheet so that the UV beam is incident parallel to the Fresnel lens surfaces and only the rise surfaces are illuminated. The surface area illuminated by the UV radiation is adjusted by the slit so that the difference in the angle of Fresnel lens in the range illuminated by UV radiation is within 1°. It is preferred that no less than two slits arranged at a distance from each other or a pipe-like slit be used as the slit, such configurations producing a UV beam with better parallelism.

The UV illumination device 7 shown in FIG. 4 comprises a light source moving device which continuously moves the light source 8 in the radial direction of rotary stand 9 and an angle changing device which changes the angle at which the UV beam outgoes toward the rotary stand 9 from −90° to 90°; the UV illumination device has a complex structure. Moreover, for exposure with such a device, it is necessary to limit the exposure range and to scan with the light source so that the entire surface of the Fresnel lens sheet be illuminated with the light beam for exposure. As a result, the exposure takes a long time. When the complex structure of the UV illumination device and extension of exposure time pose a problem, exposure can be conducted by disposing the light source in the vicinity of the focal point on the incidence side of Fresnel lens sheet. If the exposure is conducted with the light source disposed in the vicinity of the focal point on the incidence side of Fresnel lens sheet, the light beam for exposure is refracted when it falls on the Fresnel lens sheet, and this light reaches only the Fresnel lens surfaces and does not reach the rise surfaces. Therefore, single exposure is sufficient for the entire surface of Fresnel lens sheet, and scanning with the light source is unnecessary. If the light source is disposed in the vicinity of the focal point on the incidence side of Fresnel lens sheet, the light source moving device and angle changing device are not required for the illumination device for exposure and a device of simple structure is sufficient. Moreover, if the wavelength of light used for the exposure of Fresnel lens sheet is different from the wavelength of light used for the rear projection type television, the focal distance of Fresnel lens is different from a designed value. Since the wavelength of light used for the exposure of Fresnel lens sheet is usually shorter than the wavelength of light used for the rear projection type television, the focal distance of Fresnel lens sheet at the wavelength of light for exposure becomes shorter than the designed value. The position of the light source for exposure should be determined by taking this fact into account. Furthermore, when the exposure is conducted by disposing the light source in the vicinity of the focal point on the incidence side of Fresnel lens sheet, the major portion of light beam for exposure reaches the Fresnel lens surfaces, but some light also reaches the rise surfaces. However, the useless light beam that reaches the rise surfaces usually takes no more than 1% of the light beam that reaches the Fresnel lens surfaces and the difference in exposure doses between the rise surfaces and Fresnel lens surfaces is large. Therefore, only the Fresnel lens surfaces can be selectively exposed. When the exposure with the useless light reaching the rise surfaces poses a problem, this problem can be resolved because conducting coating of a photoresist by a spin coating method makes it possible to obtain, by the action of a centrifugal force, a film coated on the rise surfaces which is thicker than the film coated on the Fresnel lens surfaces.

Utilizing the above-described method for the manufacture of a Fresnel lens sheet makes it possible to provide a layer containing fine particles on the rise surfaces of a Fresnel lens original mold having Fresnel lens surfaces and rise surfaces or a transfer mold of the Fresnel lens original mold and use the Fresnel lens original mold or transfer mold of the Fresnel lens original mold as the molding die for a Fresnel lens sheet. The molds obtained by transferring those shapes may be also used as the molding die. The transferring can be conducted by conventional methods such as electroplating of the surface shape of a transfer base or molding using a thermoplastic resin, thermosetting resin, UV-curable resin or the like, and such transferring produces a shape which is inverted with respect to the surface shape of the transfer base. Furthermore, a Fresnel lens sheet with a light-diffusing layer having peaks and valleys on the rise surfaces can be manufactured by a method such hot pressing, injection molding, 2P molding, and the like, using the obtained molding die. Thus providing a light-diffusing layer with peaks and valleys on the rise surfaces of a molding die for a Fresnel lens sheet and manufacturing the Fresnel lens sheet by transferring thereof makes it possible to obtain a Fresnel lens sheet having a light-diffusing layer with peaks and valleys on the rise surfaces in a more simple manner than by providing a layer containing a light-diffusing material on each rise surface of a Fresnel lens sheet.

Embodiments

Embodiment 1

The shape of the Fresnel lens manufactured in the present embodiment is the same as that of the conventional lens, as shown by a partial cross section in FIG. 1. The height of Fresnel lenses is 0.1~70 $\mu$m. The rise angle of the Fresnel lens is 5° with respect to the optical axis of the lens. A positive photoresist (AZ Posiresist manufactured by Clariant Japan Co., Ltd.) containing 5% Tospearl 120 (average particle size 2 $\mu$m) manufactured by Toshiba Silicone Co., Ltd. as light-diffusing particles was coated (thickness of the photoresist layer was 4~6 $\mu$m) by a spin coating method on the entire surface including the Fresnel lens surfaces and rise surfaces on the outgoing light side. The photoresist was dried, followed by exposure of the photoresist by illumination with a parallel beam from the direction perpendicular to the Fresnel lens sheet from the outgoing light side of the Fresnel lens sheet. The illumination was conducted so that the light exposure dose per unit surface area of the Fresnel lens surfaces was greater than the light exposure dose per unit surface area of the rise surfaces. The exposure was conducted by using an ultrahigh-pressure mercury lamp with an output of 100 W through a 5-mm square window (slit). At this time, the Fresnel lens sheet was rotated at 60 rpm and the UV illumination unit was moved at a rate of 60 cm/min from the inner zone to the outer periphery. The Fresnel lens sheet was then immersed into a development solution to develop the photoresist, and the photoresist coated on the Fresnel lens surfaces was dissolved and removed. The average thickness of the photoresist layer remaining on the rise surfaces was 5 $\mu$m.

In the Fresnel lens sheet in accordance with the present invention that was manufactured by the above-described method, even if the useless light beam L5 was generated from the image light L1, the useless light beam L5 was diffused by the layer of photoresist on the rise surfaces (light-diffusing layer) and the brightness of the useless light beam could be greatly reduced. As a result, the formation of ghost images could be prevented and a high-contrast image could be obtained. The evaluation of the results was conducted by installing the Fresnel lens sheet obtained by the above-described method and the conventional Fresnel lens sheet employed for comparison on a rear projection TV (KP-E53MH11) manufactured by Sony Corp. (the same evaluation method was used in the below-described embodiments). The external appearance of the Fresnel lens sheet was evaluated by five randomly selected observers. All five people concluded that the external appearance was good.

Embodiment 2

The shape of the Fresnel lens manufactured in the present embodiment is the same as that of the conventional lens, as shown by a partial cross section in FIG. 1. The height of Fresnel lenses is 0.1~70 $\mu$m. The rise angle of the Fresnel lens is 5° with respect to the optical axis of the lens. A negative photoresist (AZ Negaresist manufactured by Clariant Japan Co., Ltd.) was coated (thickness of the photoresist layer was 4~6 $\mu$m) by a spin coating method on the entire surface including the Fresnel lens surfaces and rise surfaces on the outgoing light side. The photoresist was dried, followed by exposure of the photoresist by illumination with a parallel beam from the direction perpendicular to the Fresnel lens sheet from the outgoing light side of the Fresnel lens sheet. The illumination was conducted so that the light exposure dose per unit surface area of the rise surfaces was less than the light exposure dose per unit surface area of the Fresnel lens surfaces. The exposure was conducted by using an ultrahigh-pressure mercury lamp with an output of 100 W through a 5-mm square window (slit). At this time, the Fresnel lens sheet was rotated at 60 rpm and the UV illumination unit was moved at a rate of 60 mm/min from the inner zone to the outer periphery. The Fresnel lens sheet was then immersed into a development solution to develop the photoresist, and the photoresist coated on the rise surfaces was dissolved and removed. The average thickness of the photoresist layer remaining on the Fresnel lens surfaces was 5 $\mu$m. Then a coating liquid was coated (thickness of adhesive layer was 3 $\mu$m) by a spin coating method. The coating liquid was prepared by introducing 5% of Tospearl 120 (average particle size 2 $\mu$m) manufactured by Toshiba Silicone Co., Ltd. as light-diffusing particles into an adhesive composed of an organic solvent (ethyl acetate) comprising 10% transparent synthetic resin (PMMA with a degree of polymerization of about 1500). The adhesive was fixedly bonded to the rise surfaces and then the Fresnel lens sheet was immersed into a solution that expanded and dissolved the photoresist layer remaining on the Fresnel lens surfaces, but did not dissolve the adhesive, and the photoresist layer remaining on the Fresnel lens surfaces was removed together with the layer of adhesive containing light-absorbing particles that was coated on the photoresist layer. A Fresnel lens sheet was thus obtained in which an adhesive layer containing light-absorbing particles was selectively coated on the rise surface. In the Fresnel lens sheet in accordance with the present invention that was manufactured by the above-described method, the useless light beam could be diffused by the adhesive layer on the rise surfaces and the brightness of the useless light could be greatly reduced. As a result, the formation of ghost images could be prevented and a high-contrast image could be obtained. The external appearance of the Fresnel lens sheet was evaluated by five randomly selected observers. All five people concluded that the external appearance was good.

Embodiment 3

The shape of the Fresnel lens manufactured in the present embodiment is the same as that of the conventional lens, as shown by a partial cross section in FIG. 1. The height of Fresnel lenses is 0.1~70 $\mu$m. The rise angle of the Fresnel lens is 5° with respect to the optical axis of the lens. A coating liquid was coated (thickness of adhesive layer was 2 $\mu$m) by a spin coating method on the entire surface including the Fresnel lens surfaces and rise surfaces on the outgoing light side. The coating liquid was prepared by introducing 5% of Tospearl 120 (average particle size 2 $\mu$m) manufactured by Toshiba Silicone Co., Ltd. as light-diffusing particles into an adhesive composed of an organic solvent (ethyl acetate) comprising 10% transparent synthetic resin (PMMA with a degree of polymerization of about 1500). Then, a positive photoresist (AZ Posiresist manufactured by Clariant Japan Co., Ltd.) was coated (thickness of the photoresist layer was 2 $\mu$m) by a spin coating method on the entire surface of the adhesive (light-diffusing material) containing the light-diffusing particles. The photoresist was dried, followed by exposure of the photoresist by illumination with a parallel beam from the direction perpendicular to the Fresnel lens sheet from the outgoing light side of the Fresnel lens sheet. The illumination was conducted so that the light exposure dose per unit surface area of the Fresnel lens surfaces was greater than the light exposure dose per unit surface area of the rise surfaces. The exposure was conducted by using an ultrahigh-pressure mercury lamp with an output of 100 W through a 5-mm square window (slit). At this time, the Fresnel lens sheet was rotated at 60 rpm and the UV illumination unit was moved at a rate of 60 mm/min from the inner zone to the outer periphery. The Fresnel lens sheet was then immersed into a development solution to develop the photoresist, and the photoresist coated on the Fresnel lens surfaces was dissolved and removed. The average thickness of the photoresist layer remaining on the rise surfaces was 5 $\mu$m. The Fresnel lens sheet was then immersed into a solution that easily dissolved the photoresist layer containing the light-diffusing particles, but substantially did not dissolve the adhesive, and the photoresist layer containing the light-diffusing particles was removed. Then, the photoresist present on the adhesive layer on the rise surfaces was dissolved and removed and a Fresnel lens sheet was obtained in which an adhesive layer containing light-absorbing particles was selectively formed on the rise surface. In the Fresnel lens sheet manufactured by the above-described method, the useless light beam was diffused by the adhesive layer on the rise surfaces and the brightness of the useless light could be greatly reduced. As a result, the formation of ghost images could be prevented and a high-contrast image could be obtained. The external appearance of the Fresnel lens sheet was evaluated by five randomly selected observers. All five people concluded that the external appearance was good.

Embodiment 4

The shape of the Fresnel lens manufactured in the present embodiment is the same as that of the conventional lens, as shown by a partial cross section in FIG. 1. The height of Fresnel lenses is 0.1~70 $\mu$m. The rise angle of the Fresnel lens is 5° with respect to the optical axis of the lens. A positive photoresist (AZ Negaresist manufactured by Clariant Japan Co., Ltd.) containing 5% Tospearl 120 (average particle size 2 $\mu$m) manufactured by Toshiba Silicone Co., Ltd. as light-diffusing particles was coated (thickness of the photoresist layer was 4~6 $\mu$m) by a spin coating method on the entire surface including the Fresnel lens surfaces and rise surfaces on the outgoing light side. The photoresist was dried, followed by exposure of the photoresist by illumination with a parallel beam from the direction inclined to the Fresnel lens sheet from the outgoing light side of the Fresnel lens sheet. The illumination was conducted so that the light exposure dose per unit surface area of the rise surfaces was greater than the light exposure dose per unit surface area of the Fresnel lens surfaces. The exposure was conducted by using an ultrahigh-pressure mercury lamp with an output of 100 W through a 5-mm square window (slit). At this time, the Fresnel lens sheet was rotated at 60 rpm and the UV illumination unit was moved at a rate of 60 mm/min from the inner zone to the outer periphery, while the illumination angle was changed from 89° to 30°. The Fresnel lens sheet was then immersed into a development solution to develop the photoresist, and the photoresist coated on the Fresnel lens surfaces was dissolved and removed. The average thickness of the photoresist layer remaining on the rise surfaces was 5 $\mu$m. In the Fresnel lens sheet manufactured by the above-described method, the useless light beam was diffused by the adhesive layer on the rise surfaces and the brightness of the useless light could be greatly reduced. As a result, the formation of ghost images could be prevented and a high-contrast image could be obtained. The external appearance of the Fresnel lens sheet 1 was evaluated by five randomly selected observers. All five people concluded that the external appearance was good.

Embodiment 5

The shape of the Fresnel lens sheet manufactured in the present embodiment is the same as that of the conventional lens, as shown by a partial cross section in FIG. 1. The height of Fresnel lenses is 0.1~70 $\mu$m. Carbon black was used as the light-absorbing agent coated on the rise surfaces. A coating liquid was obtained by mixing carbon black with a UV-curable resin containing urethane acrylate. The coating liquid had a viscosity of 1 poise. The coating liquid was caused to adhere to the entire surface of the Fresnel lens sheet and UV illumination was conducted from the direction inclined with respect to the Fresnel lens sheet from the outgoing light side of the Fresnel lens sheet by using a UV illumination device shown in FIG. 4, while spin coating at a rate of 2000 rpm. The illumination was conducted so that the light exposure dose per unit surface area of the rise surfaces was greater than the light exposure dose per unit surface area of the Fresnel lens surface. The exposure was conducted by using an ultrahigh-pressure mercury lamp with an output of 100 W through a 5-mm square window (slit). At this time, the Fresnel lens sheet was rotated at 60 rpm and the UV illumination unit was moved at a rate of 60 mm/min from the inner zone to the outer periphery, while the illumination angle was changed from 89° to 30°. As a result, a light-absorbing layer with a thickness of about 10 $\mu$m was formed on the rise surface. No light-absorbing layer thick enough to affect the performance was formed on the Fresnel lens surfaces. In the Fresnel lens sheet manufactured by the above-described method, even if the useless light beam was generated from the image light, the useless light beam was absorbed by the light-absorbing layer on the rise surfaces and exit of the useless light beam was suppressed to a great extent. As a result, the formation of ghost images could be prevented and a high-contrast image could be obtained. The external appearance of the Fresnel lens sheet was evaluated by five randomly selected observers. All five people concluded that the external appearance was good.

Embodiment 6

A Fresnel lens sheet was fabricated in the same manner as in Embodiment 1, except that a light-absorbing agent (carbon black particles) was used instead of the light-diffusing material. In the Fresnel lens sheet manufactured by the above-described method, even if the useless light beam was generated from the image light, the useless light beam was absorbed by the light-absorbing layer on the rise surfaces and exit of the useless light beam was suppressed to a great extent. As a result, the formation of ghost images could be prevented and a high-contrast image could be obtained. The external appearance of the Fresnel lens sheet was evaluated by five randomly selected observers. All five people concluded that the external appearance was good.

Embodiment 7

A Fresnel lens sheet having a light-diffusing layer on the rise surfaces was fabricated in the same manner as in Embodiment 1. Then, the Fresnel lens sheet was used as an original mold, nickel was plated on the Fresnel lens sheet original mold, then nickel was electroplated, and a metal mold was fabricated onto which the shape of the lens surfaces and rise surfaces of Fresnel lens was transferred. A UV-curable resin comprising urethane acrylate was coated on the metal mold, pasted onto a 1-mm-thick sheet of methyl methacrylate-styrene copolymer, and UV illuminated to cure the UV-curable resin. The metal mold was then removed to obtain a Fresnel lens sheet composed of the UV-curable resin and methyl methacrylate-styrene copolymer sheet. In the Fresnel lens sheet manufactured by the above-described method, a light-diffusing layer was provided on the rise surfaces and even if the useless light beam was generated from the image light, the useless light beam was scattered by the light-diffusing layer on the rise surfaces and exit of the useless light beam was suppressed to a great extent. As a result, the formation of ghost images could be prevented and a high-contrast image could be obtained. The external appearance of the Fresnel lens sheet was evaluated by five randomly selected observers. All five people concluded that the external appearance was good.

Embodiment 8

A Fresnel lens sheet having a light-diffusing layer on the rise surfaces was fabricated in the same manner as in Embodiment 1. Then, the Fresnel lens sheet was used as an original mold, the shape of the Fresnel lens sheet original mold was transferred by using a thermosetting epoxy resin, the Fresnel lens sheet original mold was removed after curing, and an epoxy resin shaping mold was fabricated onto which the shape of the lens surfaces and rise surfaces of Fresnel lens was transferred. A UV-curable resin comprising urethane acrylate was coated on the resin shaping mold, pasted onto a 1-mm-thick sheet of methyl methacrylate-styrene copolymer, and UV illuminated to cure the UV-curable resin. The metal mold was then removed to obtain a Fresnel lens sheet composed of the UV-curable resin and methyl methacrylate-styrene copolymer sheet. In the Fresnel lens sheet manufactured by the above-described method, a light-diffusing layer was provided on the rise surfaces and even if the useless light beam was generated from the image light, the useless light beam was scattered by the light-diffusing layer on the rise surfaces and exit of the useless light beam was suppressed to a great extent. As a result, the formation of ghost images could be prevented and a high-contrast image could be obtained. The external appearance of the Fresnel lens sheet was evaluated by five randomly selected observers. All five people concluded that the external appearance was good.

Embodiment 9

A metal mold of stainless steel having the same shape as that of the target Fresnel lens was used instead of the Fresnel lens sheet, a diffusion layer with a surface structure having peaks and valleys was produced on the rise surfaces of the metal mold, and a metal molding die was fabricated in the same manner as in Embodiment 2. A Fresnel lens sheet composed of a UV-curable resin and methyl methacrylate-styrene copolymer sheet was fabricated in the same manner as in Embodiment 8 by using the molding die. In the Fresnel lens sheet manufactured by the above-described method, a light-diffusing layer was provided on the rise surfaces and even if the useless light beam was generated from the image light, the useless light beam was scattered by the light-diffusing layer on the rise surfaces and exit of the useless light beam was suppressed to a great extent. As a result, the formation of ghost images could be prevented and a high-contrast image could be obtained. The external appearance of the Fresnel lens sheet was evaluated by five randomly selected observers. All five people concluded that the external appearance was good.

Using the Fresnel lens sheet manufactured in accordance with the present invention makes it possible to suppress the formation of ghost images by the useless light and to obtain images with good contrast.

What is claimed is:

1. A method for the manufacture of a molding die suitable for the manufacture of a Fresnel lens sheet having arranged thereon a multiplicity of sawtooth-like Fresnel lenses composed of a Fresnel lens surface demonstrating a convex lens function and a rise surface located between the adjacent Fresnel lens surfaces, this sheet having a light-diffusing layer with a convexo-concave structure on said rise surfaces, the method comprising a step of forming a layer containing fine particles on the rise surfaces by:

coating a photoresist containing fine particles on the surface of a Fresnel lens original mold having Fresnel lens surfaces and rise surfaces or on the surface of a transfer mold of said Fresnel lens original mold; and illuminating with light so as to obtain mutually different light exposure doses per unit surface area on the Fresnel lens surfaces and rise surfaces.

2. The method for the manufacture of a molding die according to claim 1, further comprising a step of transferring the shape of said Fresnel lens original mold or transfer mold of said Fresnel lens original mold, after said step of forming a layer containing fine particles on the rise surfaces by coating a photoresist containing fine particles on the surface of a Fresnel lens original mold having Fresnel lens surfaces and rise surfaces or on the surface of a transfer mold of said Fresnel lens original mold and then illuminating with light so as to obtain a different light exposure doses per unit surface area on the Fresnel lens surfaces and rise surfaces.

3. The method for the manufacture of a molding die according to claim 1 or claim 2, wherein the layer of the photoresist coated on the rise surfaces is cured by illuminating with light so as to obtain a different light exposure doses per unit surface area on the Fresnel lens surfaces and rise surfaces, while coating the photoresist containing fine particles on the surface of a Fresnel lens original mold or a transfer mold of said Fresnel lens original mold by the spin coating method.

4. A method for the manufacture of a Fresnel lens sheet, comprising the step of transferring the shape of the molding die for a Fresnel lens sheet obtained by the method for the manufacture of a molding die for a Fresnel lens sheet described in any claim of claim 1 or 2.

5. A method for the manufacture of a Fresnel lens sheet, comprising the step of transferring the shape of the molding die for a Fresnel lens sheet obtained by the method for the manufacture of a molding die for a Fresnel lens sheet described in claim 3.

* * * * *